Aug. 2, 1955 T. W. HOPKINSON 2,714,656

AUDIO FREQUENCY SWEEP SYSTEM

Filed Sept. 18, 1945 2 Sheets-Sheet 1

Inventor

THOMAS W. HOPKINSON

By Ralph L Chappell

Attorney

Aug. 2, 1955 T. W. HOPKINSON 2,714,656

AUDIO FREQUENCY SWEEP SYSTEM

Filed Sept. 18, 1945 2 Sheets-Sheet 2

Inventor

THOMAS W. HOPKINSON

By Ralph L. Chappell

Attorney 2,714,656
Patented Aug. 2, 1955

2,714,656

AUDIO FREQUENCY SWEEP SYSTEM

Thomas W. Hopkinson, Alexandria, Va.

Application September 18, 1945, Serial No. 617,159
7 Claims. (Cl. 250—17)
(Granted under Title 35, U. S. Code (1952), sec. 266)

This invention relates to frequency modulation type radio systems and signal generators.

An object of this invention is to provide a means for sweeping the frequency of an oscillation generator equal amounts above and below a center of frequency.

Another object of this invention is to provide a system for generating an interfering radio signal for use in impairing radio communications between unfriendly forces.

Another object of this invention is to provide a system for aperiodically sweeping the frequency of an oscillation generator equal amounts above and below a center frequency.

Other objects and features of the present invention will become apparent upon a careful consideration of the following detailed description when taken together with the accompanying drawings.

Figure 2A:
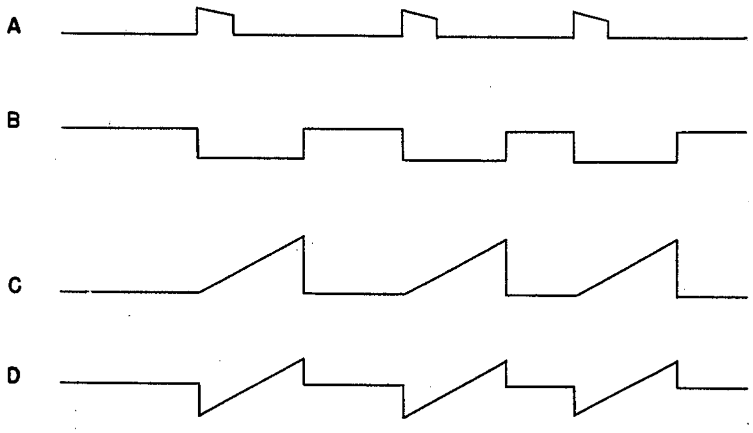
Fig. 2 is another diagram of the same embodiment in which some of the circuit components are shown in schematic form.

Fig. 2*a* shows a series of waveforms useful in explaining the operation of the invention.

Figure 1:
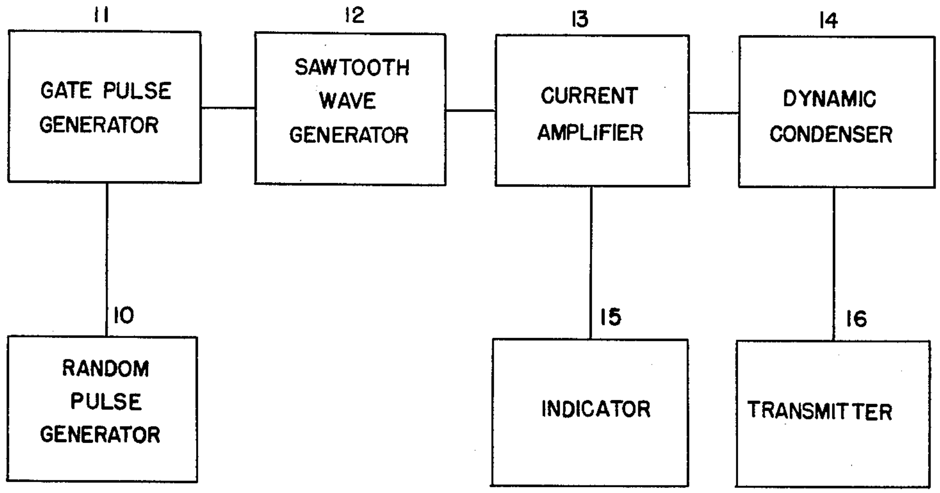
Fig. 1 is a block diagram of the preferred embodiment of this invention and shows the interrelation of the component circuits.

In the specific embodiment shown in Fig. 1 the invention is disclosed as a frequency modulation system for generating an interfering signal for impairing radio communications between unfriendly forces. In doing so, the output of a suitable random impulse source 10 such as that described in the application of Robert G. Mills, filed September 5, 1945, Serial No. 614,582, now Patent No. 2,686,876, issued August 17, 1954 is transformed into a correspondingly random saw tooth wave. In the preferred case this saw tooth wave is one having abrupt and sense opposed leading and trailing edges and is created by the combined actions of the gate pulse generator 11 and the sawtooth wave generator 12. The gate pulse generator may be of any suitable type such as a "one shot" multivibrator, which has been arranged so as to produce a negative voltage pulse of finite duration in response to the output from the random pulse generator 10.

The sawtooth wave generator 12 is connected to the gate pulse generator 11 and is rendered operative thereby. It functions to generate a sawtooth voltage wave having a duration equal to the duration of the gate pulse output from generator 11. This gate pulse from generator 11 is added to the output from the sawtooth generator 12 as hereinafter described in detail to yield a sawtooth wave shown as waveform D in Fig. 2*a*. This wave is then applied through a suitable means to vary the frequency of the transmitter 16. In the preferred case, the transmitter frequency is varied by a coil operated dynamic condenser 14 connected in shunt with the oscillator tank circuit of the transmitter. Because of the low impedance of the dynamic condenser, a current amplifier circuit 13 hereinafter described in detail is employed to convert the voltage waveform to a corresponding current waveform.

It is understood that, within the scope of the present invention, an ordinary signal oscillator could supplant the transmitter and that other means such as a reactance tube and its requisite connections could be used for varying the oscillator frequency.

For effective use of this invention with various transmitters, it is necessary that the range of frequencies through which the transmitters are swept can be established to a suitable degree of accuracy. For example, it is found that for impairing continuous wave communications between unfriendly forces, certain ranges of frequencies are most effective. In order to provide a simple and reliable method of tuning the invention to sweep any suitable transmitter through a desired range of frequencies, an indicator circuit 15 is associated with current amplifier 13. The indicator circuit is used in conjunction with a radio receiver (not shown) and an audio oscillator (not shown). In the preferred embodiment of this invention, the indicator circuit described in the copending application of Thomas W. Hopkinson and Robert G. Mills, Serial Number 616,428, now abandoned, is used.

Figure 2:
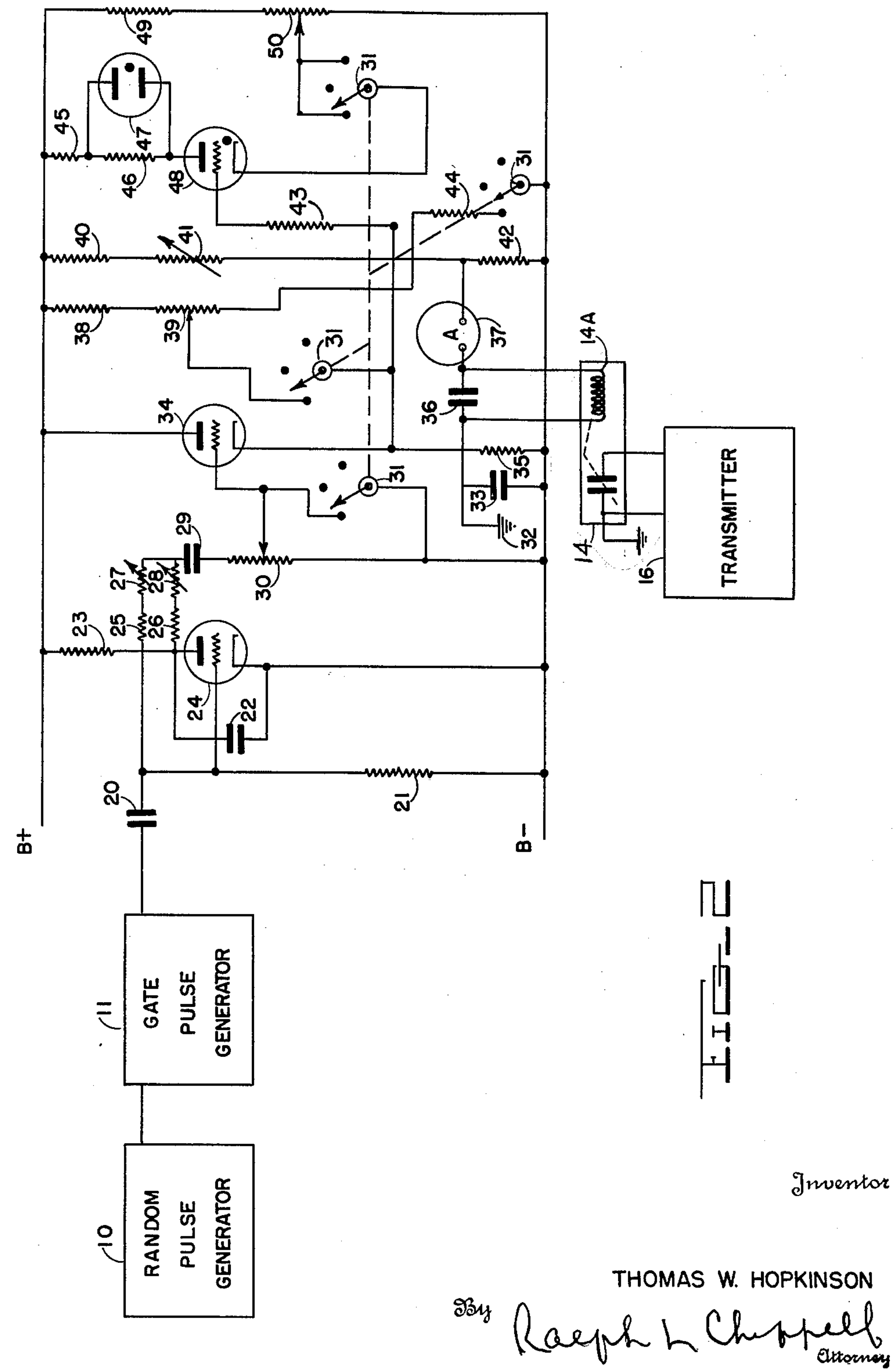

In greater detail and according to Fig. 2 and Fig. 2*a* the aperiodically recurring negative pulse output from generator 11, shown as waveform B, resulting from the aperiodical keying pulses from generator 10, shown as waveform A, is applied through capacitor 20 and resistor 21 to the grid of the vacuum tube component 24. Tube 24 by its grid connection through resistor 21 is biased normally conducting but is cut off by the negative voltage pulse from generator 11. At the instant tube 24 is cut off, which corresponds to the leading edge of the negative pulse, the voltage across the load resistor 23 tends to rise abruptly. This tendency is tempered by the shunt capacitor 22 which must be charged, thereby creating a substantially linear rather than abrupt change in voltage at the plate of tube 24. The charging time constant of this capacitor is sufficiently large that for the duration of the gate pulse the voltage rise is approximately linear. Plate load resistor 23 is selected to provide a suitable range of voltage variation. At the end of the gate pulse, tube 24 is returned to conduction to rapidly discharge capacitor 22 to its normal potential. Consequently, the voltage waveform which appears at the plate of tube 24 is substantially that shown as waveform C.

The normal or zero level of the sawtooth wave which is obtainable at the plate of tube 24 is at the bottom of the wave envelope and if applied to the dynamic condenser would sweep the frequency in only one direction from the normal quiescent value. To obtain the desired sweep voltage waveform shown in waveform D, the sawtooth wave from tube 24 is shifted downward by mixing it with the rectangular negative pulse from the gate pulse generator 11. In this mixing action, the rectangular negative pulse, waveform B, is applied through resistors 25 and 27, and the sawtooth waveshape, waveform C, is applied through resistors 26 and 28 to capacitor 29. The wave shape of the combination is that shown as waveform D. Resistors 27 and 28 are variable resistors used to adjust the symmetry of the waveshape.

The desired sawtooth voltage wave is applied through capacitor 29 to the gain control potentiometer 30 of the current amplifier stage. It is the purpose of this stage to convert the voltage waveform which originates in a high impedance circuit, to a current wave with specific peak amplitudes which will be passed through a low impedance load. Since, in most conditions of operation, the principal frequency components of the sawtooth wave are in the sub audio region, and since it is necessary that the current through the load reverse, conventional coupling devices are not suitable.

Tube 34 operates essentially as a cathode follower with cathode resistor 35. One terminal of the load, the coil of dynamic condenser 14, is connected directly to the cathode of tube 34; the other terminal of the load is connected through milliammeter 37 to a voltage divider comprising resistor 40, variable resistor 41, and resistor 42. Variable resistor 41 is adjusted so that the two terminals of the load will be at equal potential in the no signal condition. The adjustment is made by obtaining a zero reading on milliammeter 37.

It is apparent that a bridge circuit has been created, one leg of which is the resistance of tube 34. As this resistance is varied above and below the quiescent value by the signal applied to the control grid from gain control resistor 30, corresponding changes in current will flow through the load. The output impedance of the bridge compared with that of the load is sufficiently high that the bridge acts substantially as a constant current generator; consequently, if it is desired to drive a plurality of loads from the same source, they are connected in series.

In this embodiment of the present invention, the load is a dynamic condenser 14 in which the capacity is a substantially linear function of the current passed through its driving coil. One terminal of both the driving coil 14*a* and the condenser are grounded to the chassis; consequently, it is necessary that the circuit be grounded at 32 as shown and that the negative side of the power supply be isolated from ground.

Capacitor 36, which is connected in shunt with the coil of the dynamic condenser, has been found useful in reducing undesired transients. The physical characteristics of the dynamic condenser are such that the diaphragm is shocked into mechanical oscillations by sudden displacements, which oscillations produce damped oscillatory countervoltages. Capacitor 36 provides sufficient damping so that the diaphragm does not oscillate.

It is understood that in other embodiments of this invention, the load used may be ungrounded or may have no tendency toward mechanical oscillation. Under such circumstances the pertinent feature or features described in the preceding two paragraphs should be unnecessary.

The dynamic condenser 14 is placed in shunt across the oscillator tank circuit of a suitable radio transmitter or oscillation generator. Variations in the capacitance of the dynamic condenser will result in corresponding changes in the output frequency of the transmitter.

For the most effective operation of this invention in connection with imparing continuous wave communications between unfriendly forces, it is necessary that the carrier frequency of the interfering transmitter with which this invention is used be tuned as close as possible to the carrier frequency of the enemy transmitter, and that the interfering transmitter be swept through a specific narrow band of frequencies. The following procedure is employed in the use of the equipment for the purposes under consideration. The interfering transmitter is first tuned to the carrier frequency of the enemy transmitter by zero beating in a communications receiver, after which operation small deviations of the interfering transmitter frequency result in an audio beat note in the receiver, not shown. A steady signal is then applied to the dynamic condenser and adjusted until the beat note in the receiver is equal to a given standard. The standard is provided by a calibrated audio oscillator, not shown, and the two notes may be rendered equal by aural comparison. The indicator circuit is then adjusted so that a gas tube is just fired by this signal, and, finally, the gain control potentiometer input to the current amplifier is adjusted so that the peak of the sweep signal is also just sufficient to fire the same gas tube.

The following circuits and circuit elements, which are also described in the copending Hopkinson and Mills application supra, make possible these adjustments.

Switch 31 is a four stage three position switch used in the adjustment procedure.

When the switch is placed in the extreme left position, the grid of tube 34 is connected to the negative side of the power supply, thus removing the sawtooth signal from this tube. Also a voltage divider comprising resistors 38, and 44, and potentiometer 39 is connected across the power supply, and the movable arm on potentiometer 39 is connected to the cathode of tube 34 introducing an unbalance in the bridge circuit and thus causing current to flow through the dynamic condenser. The potential at the cathode of tube 34 and thus the amount of current flowing through the dynamic condenser is varied with the position of the tap on resistor 39. Finally, the cathode of a thyratron gas tube 48 is connected to the movable tap on potentiometer 50 which is in series with resistor 49 across the power supply. Since the control grid of thyratron 48 is permanently connected through resistor 43 to the cathode of tube 34, the movable tap on potentiometer 50 may be adjusted to provide the cathode of thyratron 48 with a potential such that the thyratron 48 will just fire for a selected potential at the cathode of tube 34. In the plate circuit of thyratron 48 are load resistors 45 and 46. In shunt with resistor 46 is neon lamp 47 which is luminous when the thyratron is fired.

In this left position of switch 31, the tap on potentiometer 39 is adjusted until the beat note from the communications receiver is equal in pitch to that obtained from the calibrated audio oscillator. Then the tap on potentiometer 50 is moved upward until thyratron 48 just fires as indicated by neon lamp 47. The potential at the cathode of tube 34 which yields the desired frequency deviation will then be just sufficient to activate the indicator circuit.

When switch 31 is moved from the left position to the right position, the grid of tube 34 is disconnected from the negative side of the power supply; resistor 44 is disconnected from the negative side of the power supply; and the cathode of tube 34 is disconnected from the movable tap on potentiometer 39. The cathode of thyratron 48, however, remains connected to the movable tap on potentiometer 50.

In this right position of the switch 31 the sweep signal is applied to the current amplifier bridge which operates the dynamic condenser in the normal manner described in previous sections of this application. The amplitude of the input signal of the grid of tube 34 is adjusted by moving the tap on potentiometer 30 upward until the neon lamp 47 again becomes luminous. The peak of the sawtooth signal then is causing a potential at the cathode of tube 34 which is equal to that which prevailed when a steady signal was producing the desired frequency deviation.

When switch 31 is moved from the right position to the center position, the cathode of thyratron 48 is disconnected from potentiometer 50 thus disabling the thyratron indicator circuit. This position is the normal operating position of the equipment.

The equipment described has several advantages as a means of impairing continuous wave communications between unfriendly forces. The interfering effect is derived from the carrier itself rather than from modulating sidebands and consequently provides a more efficient use of available transmitter power. The balanced waveshape permits the mean frequency of the interfering transmitter to remain as close as possible to the frequency of the enemy transmitter where it is found that maximum effectiveness is obtained. The random keying is found to be very effective in impairing intelligibility.

Although I have shown and described only a certain and specific embodiment of the invention I am fully aware of the many modifications possible thereof. Therefore, this invention is not to be limited except insofar as is necessitated by the spirit of the prior art.

The invention described herein may be manufactured and used by or for the Government of the United States of America for governmental purposes without the payment of any royalties thereon or therefor.

What is claimed is:

1. The combination of, a radio frequency transmitter, a random pulse generator arranged to produce a uniform output pulse, a saw-tooth wave generating means connected to said pulse generator and operative in response thereto for producing a first saw-tooth wave having a duration equal to the duration of the output pulse from said pulse generator, circuit means receiving both the output from said pulse generator and said saw-tooth wave generator in such a manner as to yield a second saw-tooth wave having abrupt and sense opposed leading and trailing edges, and means connected to said radio frequency transmitter operative in response to said second named saw-tooth wave for varying the frequency of operation thereof in accordance with said second named saw-tooth wave.

2. The combination of, a radio frequency transmitter, a random pulse generator, a saw-tooth wave generating means connected to said pulse generator and operative in response thereto, and tuning means connected to said radio frequency transmitter and operative in response to said saw-tooth wave generator for varying the frequency of operation of said transmitter.

3. The combination of, a radio frequency transmitter, a random pulse generator arranged to produce a uniform output pulse, a saw-tooth wave generating means connected to said pulse generator and operative in response thereto for producing a first saw-tooth wave having a duration equal to the duration of the output pulse from said pulse generator, circuit means receiving both the output from said pulse generator and said saw-tooth wave generator in such a manner as to yield a second saw-tooth wave having abrupt and sense opposed leading and trailing edges, and a coil operated dynamic capacitor connected to said radio frequency transmitter in such a manner as to form in part a tuning adjustment therefor, the coil of said capacitor being adapted to receive said second named saw-tooth wave so as to actuate said capacitor and thereby vary the frequency of said radio frequency transmitter.

4. The combination of, a radio frequency transmitter, a random gate pulse generator, a sawtooth wave generator comprising a normally conducting vacuum tube associated with said random gate pulse generator so as to be cut off by the gate pulse output therefrom and a suitable capacitor in shunt with said tube, means for combining the output of said random gate pulse generator with the output of said sawtooth wave generator to form a composite signal, and means connected to said radio frequency transmitter and operative in response to said composite signal for varying the frequency of operation of said radio frequency radio transmitter in accordance with said signal.

5. The combination of, an oscillation generator, a random gate pulse generator, a sawtooth wave generator comprising a normally conducting vacuum tube associated with said gate pulse generator so as to be cut off by the gate pulse output therefrom, and a suitable capacitor in shunt with said vacuum tube, means for combining the output of said gate pulse generator with the output of said sawtooth wave generator to form a composite signal, and means connected to said oscillation generator and operative in response to said composite signal for varying the frequency of operation of said oscillation generator in accordance with said composite signal.

6. The combination of, an oscillation generator, a random gate pulse generator, a sawtooth wave generator connected to said random gate pulse generator and responding to the output therefrom to yield sawtooth voltage waves having a period equal to the duration of the gate pulses and having abrupt and sense opposed leading and trailing edges, means for varying the frequency of said oscillation generator in accordance with said sawtooth voltage waves comprising a coil actuated dynamic condenser in shunt with the oscillation generator tank circuit, said coil being connected across one pair of diagonal terminals of a bridge circuit, the other pair of diagonal terminals of said bridge circuit being connected across the power supply, one leg of said bridge being a vacuum tube responsive to said sawtooth voltage wave.

7. The combination of a radio frequency transmitter, a random gate pulse generator, a saw tooth generator connected to said random gate pulse generator and responding to the output therefrom to yield sawtooth voltage waves having a period equal to the duration of the gate pulses and having abrupt and sense opposed leading and trailing edges, means for varying the frequency of said radio frequency transmitter in accordance with said sawtooth voltage waves comprising a coil actuated dynamic condenser in shunt with the radio frequency transmitter tank circuit, said coil being connected across one pair of diagonal terminals of a bridge circuit, the other pair of diagonal terminals of said bridge circuit being connected across a power supply, one leg of said bridge being a vacuum tube responsive to said sawtooth voltage wave.

References Cited in the file of this patent

UNITED STATES PATENTS

| | | |
|---|---|---|
| 1,972,964 | Wolcott, Jr. | Sept. 11, 1934 |
| 2,082,317 | Barber | June 1, 1937 |
| 2,253,975 | Guanella | Aug. 26, 1941 |
| 2,368,448 | Cook | Jan. 30, 1945 |